US008604688B2

(12) United States Patent
Shin et al.

(10) Patent No.: US 8,604,688 B2
(45) Date of Patent: *Dec. 10, 2013

(54) ORGANIC LIGHT-EMITTING DISPLAY DEVICE AND METHOD OF FABRICATING THE SAME

(75) Inventors: Hyun-Eok Shin, Suwon-si (KR); Min-Ki Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

This patent is subject to a terminal disclaimer.

(21) Appl. No.: 13/109,910

(22) Filed: May 17, 2011

(65) Prior Publication Data

US 2011/0215330 A1  Sep. 8, 2011

Related U.S. Application Data

(62) Division of application No. 11/591,910, filed on Nov. 1, 2006, now Pat. No. 7,977,860.

(30) Foreign Application Priority Data

Nov. 2, 2005  (KR) ........................ 10-2005-0104549

(51) Int. Cl.
*H01L 51/50* (2006.01)
(52) U.S. Cl.
USPC .......................................... 313/504; 313/506
(58) Field of Classification Search
USPC ................................................ 313/503, 506
See application file for complete search history.

(56) References Cited

U.S. PATENT DOCUMENTS

| | | | |
|---|---|---|---|
| 6,828,205 B2 | 12/2004 | Tsai et al. | |
| 7,453,198 B2 | 11/2008 | Kang et al. | |
| 7,486,016 B2 | 2/2009 | Lee | |
| 7,524,226 B2 | 4/2009 | Winters | |
| 7,800,296 B2 | 9/2010 | Shin | |
| 7,977,860 B2 * | 7/2011 | Shin et al. ..................... | 313/503 |
| 2003/0181042 A1 | 9/2003 | Chen et al. | |
| 2004/0124766 A1 | 7/2004 | Nakagawa et al. | |
| 2004/0245917 A1 | 12/2004 | Lu et al. | |
| 2005/0006648 A1 | 1/2005 | Yamazaki et al. | |
| 2005/0084994 A1 | 4/2005 | Yamazaki et al. | |
| 2005/0224789 A1 | 10/2005 | Seo et al. | |
| 2005/0236629 A1 | 10/2005 | Lee et al. | |
| 2006/0197086 A1 | 9/2006 | Rhee et al. | |
| 2006/0251924 A1 | 11/2006 | Lu et al. | |

* cited by examiner

*Primary Examiner* — Britt D Hanley
(74) *Attorney, Agent, or Firm* — Christie, Parker & Hale, LLP

(57) ABSTRACT

An organic light-emitting display device and a method of fabricating the same. The organic light-emitting display device includes: a substrate; a first electrode including a first metal layer disposed on the substrate and formed of titanium (Ti), aluminum (Al), a titanium or aluminum alloy, a second metal layer disposed on the first metal layer, and a transparent conductive layer disposed on the second metal layer; an organic layer disposed on the first electrode and including at least one organic emission layer; and a second electrode disposed on the organic layer. The method includes: forming a first electrode including a first metal layer formed of Ti, Al, or a titanium or aluminum alloy, a second metal layer, and a transparent conductive layer, on a substrate; forming an organic layer including at least one organic emission layer on the first electrode; and forming a second electrode on the organic layer.

5 Claims, 4 Drawing Sheets

ORGANIC LIGHT-EMITTING DISPLAY DEVICE AND METHOD OF FABRICATING THE SAME

CROSS-REFERENCE TO RELATED APPLICATION

This application is a divisional of U.S. patent application Ser. No. 11/591,910, filed Nov. 1, 2006, now U.S. Pat. No. 7,977,860, issued Jul. 12, 2011; which claims priority to and the benefit of Korean Patent Application No. 10-2005-0104549, filed Nov. 2, 2005 in the Korean Intellectual Property Office, the entire contents of both of which are incorporated herein by reference.

BACKGROUND OF THE INVENTION

1. Field of the Invention

The present invention relates to an organic light-emitting display device and a method of fabricating the same, and more particularly, to an organic light-emitting display device capable of enhancing reflectivity and adhesion between a first electrode and a planarization layer.

2. Description of the Related Art

A conventional organic light-emitting display device includes a first electrode, an organic emission layer formed on the first electrode, and a second electrode formed on the organic emission layer. In the organic light-emitting display device, when a voltage is applied between the first electrode and the second electrode, holes are injected into the organic emission layer from the first electrode and electrons are injected into the organic emission layer from the second electrode. The holes and electrons injected into the organic emission layer are recombined in the organic emission layer to create excitons, which emit light when transitioning from an excited state to a ground state.

In the organic light-emitting display device, since the first electrode is a reflective type, i.e., formed to reflect light, and the second electrode is a transparent type, i.e., formed to transmit light, a top-emission organic light-emitting display device that emits light emitted from the organic emission layer toward the second electrode can be formed.

Here, while a conductive material having an excellent reflection property and an appropriate work function, is suitable for the reflective-type first electrode, it appears that there is no applicable single material satisfying the above properties at present.

Therefore, to satisfy the properties, the reflective type first electrode is formed in a multi-layer structure.

FIG. 1 is a schematic cross-sectional view illustrating a conventional method of fabricating an organic light-emitting display device including a reflective type first electrode.

Referring to FIG. 1, a reflective metal layer 11a is formed of aluminum or an aluminum alloy on a substrate 10, and then a transparent conductive layer 11b such as indium tin oxide (ITO) or indium zinc oxide (IZO) is formed on the reflective metal layer 11a.

Then, a photoresist pattern is formed on the transparent conductive layer 11b, and the transparent conductive layer 11b and the reflective metal layer 11a are sequentially etched using the photoresist pattern as a mask. Accordingly, a first electrode 11 in which the reflective metal layer 11a and the transparent conductive layer 11b are sequentially stacked is formed. Thereafter, the photoresist pattern is removed using a strip solution.

Subsequently, the organic light-emitting display device is fabricated by forming an organic layer including at least an organic emission layer (not shown) on the first electrode 11 and by forming a second electrode (not shown) on the organic layer.

In the first electrode 11, the transparent conductive layer 11b has a high work function and is also transparent, and the reflective metal layer 11a formed of aluminum, etc., is a layer having an excellent reflection property. Therefore, the first electrode 11 may easily inject holes into the organic emission layer, and also efficiently reflect light emitted from the organic emission layer.

However, since a large difference generally exists between the work function of the reflective metal layer 11a formed of aluminum and the work function of the ITO layer 11b, there is a deterioration of interface properties between the layers, which results in deterioration of reflectivity between the layers.

Also, when the photoresist pattern is removed after the reflective metal layer 11a and the transparent conductive layer 11b are etched, the reflective metal layer 11a and the transparent conductive layer 11b are concurrently exposed to the strip solution, which may result in corrosion between the reflective metal layer 11a and the transparent conductive layer 11b due to a galvanic effect.

Accordingly, to prevent the reflective metal layer 11a and the transparent conductive layer 11b from being concurrently exposed to the strip solution, the reflective metal layer 11a is formed in an island pattern, which also requires another step of patterning the reflective metal layer 11a and the transparent conductive layer 11b.

SUMMARY OF THE INVENTION

The present invention, in one embodiment, provides an organic light-emitting display device and a method of fabricating the same, capable of enhancing reflectivity and adhesion between a first electrode and a planarization layer.

In an exemplary embodiment of the present invention, an organic light-emitting display device includes: a substrate; a first electrode including a first metal layer disposed on the substrate and formed of titanium (Ti), aluminum (Al), a titanium alloy or an aluminum alloy, a second metal layer disposed on the first metal layer, and a transparent conductive layer disposed on the second metal layer; an organic layer disposed on the first electrode and including at least one organic emission layer; and a second electrode disposed on the organic layer.

In another exemplary embodiment of the present invention, a method of fabricating an organic light-emitting display device, includes: forming a first electrode on the substrate, the first electrode including a first metal layer formed of titanium (Ti), aluminum (Al), a titanium alloy or an aluminum alloy, a second metal layer, and a transparent conductive layer; forming an organic layer including at least one organic emission layer on the first electrode; and forming a second electrode on the organic layer.

In yet another exemplary embodiment of the present invention, an electronic appliance includes: a body containing electronics; and the organic light-emitting display device mounted on the body.

BRIEF DESCRIPTION OF THE DRAWINGS

The above and other features of the present invention will be described in reference to certain exemplary embodiments thereof with reference to the attached drawings in which.

DETAILED DESCRIPTION

The present invention will now be described more fully hereinafter with reference to the accompanying drawings, in which exemplary embodiments of the invention are shown.

Figure 1:
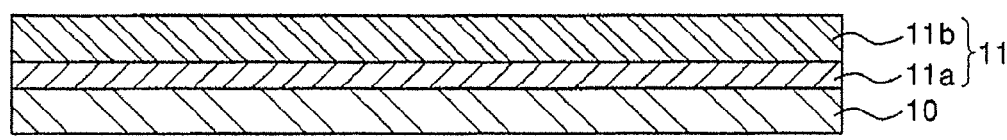
FIG. 1 is a schematic cross-sectional view illustrating a conventional method of fabricating an organic light-emitting display device.
Figure 2:
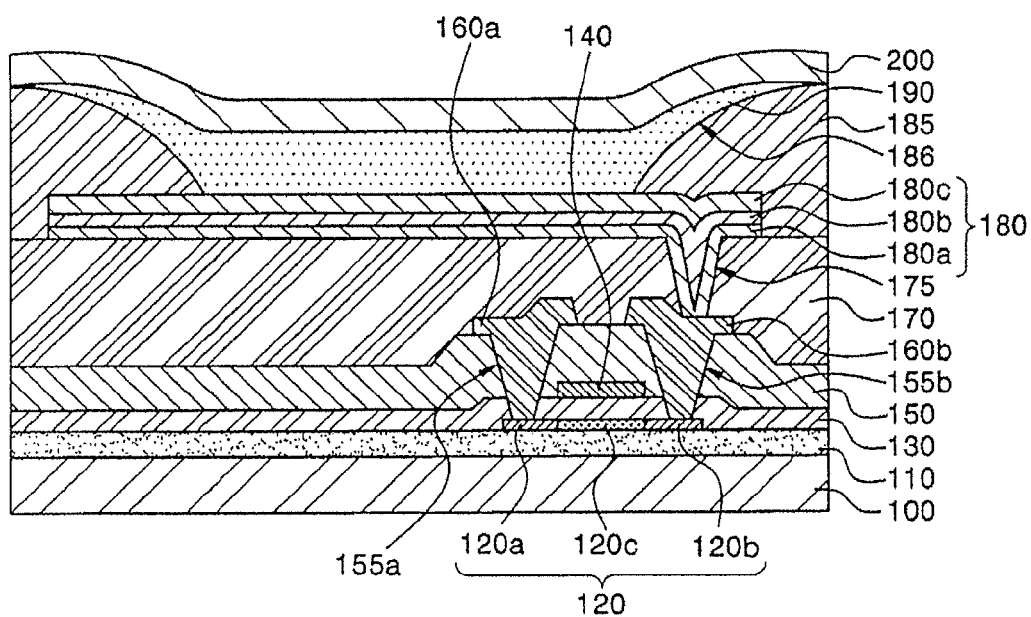
FIG. 2 is a cross-sectional view illustrating a method of fabricating an organic light-emitting display device in accordance with an exemplary embodiment of the present invention.

FIG. 2 is a cross-sectional view illustrating a method of fabricating an organic light-emitting display device in accordance with an exemplary embodiment of the present invention.

Referring to FIG. 2, a buffer layer 110 is disposed on a substrate 100 formed of glass or plastic. The buffer layer 110 is formed to protect a thin film transistor to be formed in a subsequent process from impurities such as alkali ions flowing out from the substrate 100, and is formed of a silicon oxide ($SiO_2$) layer or a silicon nitride ($SiN_x$) layer.

Subsequently, a semiconductor layer 120 having source and drain regions 120a and 120b, and a channel region 120c, is formed on the buffer layer 110. To form the semiconductor layer 120, an amorphous silicon layer is formed on the buffer layer 110, crystallized by an excimer laser annealing (ELA) method, a sequential lateral solidification (SLS) method, a metal induced crystallization (MIC) method, a metal induced lateral crystallization (MILC) method or any other suitable method, and then patterned to form a polycrystalline silicon layer.

A gate insulating layer 130 is formed on the entire surface of the substrate including the semiconductor layer 120. In one embodiment, the gate insulating layer 130 may be formed of a silicon oxide ($SiO_2$) layer, a silicon nitride ($SiN_x$) layer or a stacked layer of the silicon oxide ($SiO_2$) layer and the silicon nitride ($SiN_x$) layer.

A gate electrode 140 may be formed at a predetermined region of the gate insulating layer 130 corresponding to the semiconductor layer 120. The gate electrode 140 may be formed of one selected from the group consisting of aluminum (Al), an aluminum alloy (Al alloy), molybdenum (Mo), a molybdenum alloy (Mo alloy), and combinations thereof. In one embodiment, the gate electrode 140 is formed of a molybdenum-tungsten alloy.

Then, an interlayer insulating layer 150 is formed on the entire surface of the substrate including the gate electrode 140. The interlayer insulating layer 150 is formed to insulate the gate electrode 140 from source and drain electrodes 160a and 160b to be formed in the subsequent process, and is formed of a silicon nitride ($SiN_x$) layer or a silicon oxide ($SiO_2$) layer.

Next, contact holes 155a and 155b that respectively expose portions of the source and drain regions 120a and 120b are formed by etching the interlayer insulating layer 150 and the gate insulating layer 130.

Subsequently, source and drain electrodes 160a and 160b electrically connected to the source and drain regions 120a and 120b through the contact holes 155a and 155b are formed. The source and drain electrodes 160a and 160b are formed of a low resistance material to reduce interconnection resistance, and thus are formed of a metal such as molybdenum (Mo), tungsten (W), titanium (Ti), aluminum (Al), etc.

A planarization layer 170 is formed on the entire surface of the substrate including the source and drain electrodes 160a and 160b. The planarization layer 170 may be formed to a thickness of 1.2 μm to 2.5 μm using an organic matter such as polyimide, benzocyclobutene series resin, acrylate, etc.

Next, a via hole 175 that exposes a part of the drain electrode 160b is formed by etching the planarization layer 170. Then, a first metal layer 180a and a second metal layer 180b are sequentially formed to be contacted with the drain electrode 160b through the via hole 175. The first and second metal layers 180a and 180b may be formed by a sputtering method.

The first metal layer 180a may be formed of titanium (Ti), aluminum (Al), a titanium alloy or an aluminum alloy having good adhesion to the planarization layer. The titanium or the titanium alloy may prevent diffusion of aluminum and may be etched by dry etching. The aluminum alloy may include neodymium (Nd). Since the titanium Ti or the aluminum Al is a low resistance metal, and the first metal layer 180a is formed of a material similar to that of the drain electrode 160b, a problem such as resistance substantially does not occur when such metals are in contact with the drain electrode 160b.

The second metal layer 180b is a metal layer that reflects light, and is formed of a metal having an excellent reflection property, for example, silver (Ag) or a silver alloy (Ag alloy). The silver alloy may include at least one of samarium (Sm), copper (Cu), terbium (Tb), molybdenum (Mo) or tungsten (W).

The thickness of the first metal layer 180a may be 50 Å to 200 Å (0.005 μm to 0.02 μm). In one embodiment, if the thickness of the first metal layer 180a is less than 50 Å, thickness uniformity of the first metal layer 180a cannot be ensured, and if the thickness of the first metal layer 180a is greater than 200 Å, adhesion between the first metal layer 180a and the second metal layer 180b is reduced due to high film stress of the first metal layer 180a.

Also, the second metal layer 180b may be formed to a thickness of 500 Å to 2000 Å (0.05 μm to 0.2 μm). This is because in one embodiment appropriate reflection properties are not obtained when the thickness of the second metal layer 180b is less than 500 Å, and when the thickness of the second metal layer 180b is greater than 2000 Å, adhesion between the first metal layer 180a and a transparent conductive layer 180c to be formed in the following process is reduced due to high film stress.

Subsequently, the transparent conductive layer 180c is formed on the second metal layer 180b. The transparent conductive layer 180c is a transparent layer that has conductivity, and may be formed of indium tin oxide (ITO) or indium zinc oxide (IZO) having a high work function.

Then, a reflective type first electrode 180 in which the first metal layer 180a, the second metal layer 180b, and the transparent conductive layer 180c are sequentially stacked, is formed by forming a photoresist pattern on the transparent conductive layer 180c and then sequentially etching the transparent conductive layer 180c, the second metal layer 180b, and the first metal layer 180a using the photoresist pattern as a mask. Then, the photoresist pattern is removed using a strip solution.

In one embodiment, the first electrode 180 may enhance adhesion between the first electrode 180 and the planarization layer 170 since titanium having good adhesion is used as the first metal layer 180a.

Also, in the first electrode 180, since silver or a silver alloy having good reflectivity is used as the second metal layer 180b in the described embodiment, the reflection property of the first electrode 180 may be improved.

Moreover, when removing the photoresist pattern using the strip solution, since a galvanic effect does not occur even if the first and second metal layers 180a and 180b, and the transparent conductive layer 180c are simultaneously (or concurrently) exposed to the strip solution, the layers may be blanket-etched, thereby reducing the process time.

After the first electrode 180 is formed, a surface of the first electrode 180 is cleaned with water, and then a pixel defining layer 185 is formed on the transparent conductive layer 180c.

Next, an opening 186 which exposes a predetermined region of the transparent conductive layer 180c and defines an emission region is formed in the pixel defining layer 185 by exposing the pixel defining layer 185 using a photomask.

The pixel defining layer 185 may be formed of one selected from the group consisting of acrylic photoresist, benzocyclobutene (BCB), phenolic photoresist, and polyimide photoresist.

Then, an organic layer 190 including at least one organic emission layer is formed on the exposed transparent conductive layer 180c. The organic layer 190 may include a hole-injection layer, a hole transport layer, an electron injection layer, and/or an electron transport layer in addition to the organic emission layer.

Subsequently, a second electrode 200 is formed on the organic layer 190. The second electrode 200 may be formed of one selected from the group consisting of magnesium (Mg), calcium (Ca), aluminum (Al), silver (Ag), barium (Ba), and an alloy thereof, and may be formed thick enough to transmit light. In other embodiments, the second electrode 200 may be formed of a transparent material such as ITO or IZO.

As a result, the organic light-emitting display device including the reflective type first electrode 180, the second electrode 200, and the organic layer 190 interposed therebetween may be fabricated.

Figure 3:
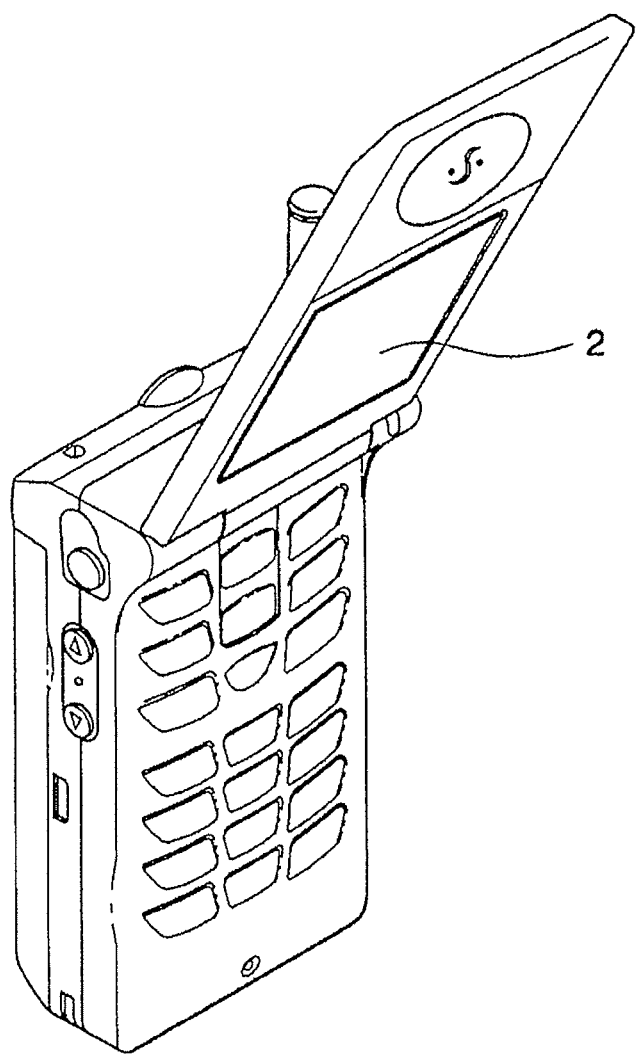
FIG. 3 illustrates a mobile terminal, one of electronic appliances using the organic light-emitting display device according to an exemplary embodiment of the present invention.

FIG. 3 illustrates a mobile terminal 1, one of electronic appliances using the organic light-emitting display device according to an exemplary embodiment of the present invention.

Referring to FIG. 3, the mobile terminal 1 includes an organic light-emitting display device 2. The mobile terminal 1 also includes a body containing electronics, on which the organic light-emitting display device 2 is mounted. In the described embodiment, the organic light-emitting display device 2 is fabricated by sequentially forming a first electrode in which one of titanium (Ti), aluminum (Al), a titanium alloy or an aluminum alloy, and a silver or a silver alloy, and ITO or IZO are sequentially stacked on a substrate, an organic layer including an organic emission layer, and a second electrode. A thin film transistor, a capacitor, and a planarization layer are formed between the substrate and the first electrode. Here, the titanium (Ti), aluminum (Al), a titanium alloy or an aluminum alloy may improve adhesion with the planarization layer, thereby considerably reducing dark spots. Also, the titanium (Ti), aluminum (Al), a titanium alloy or an aluminum alloy enables resistance of the first electrode and contact resistance between the source and drain electrodes to be reduced, thereby lowering the drive voltage. The mobile terminal having the organic light-emitting display device has an enhanced display. Therefore, the quality of the product may be improved.

While the embodiments have been described with reference to the mobile terminal as an example of the electronic appliance, variations may be made to the present invention without departing from the spirit or scope of the present invention.

Hereinafter, although the present invention is further described with reference to certain exemplary embodiments thereof, it will be understood by those skilled in the art that a variety of modifications and variations may be made to the present invention without departing from the spirit or scope of the present invention defined in the appended claims, and their equivalents.

First Embodiment

A titanium (Ti) layer was formed to a thickness of 200 Å (0.02 μm) on a substrate, a silver alloy layer, i.e., ATD (available from Hitachi) was formed to a thickness of 1000 Å (0.1 μm) on the titanium (Ti) layer, and indium tin oxide (ITO) was formed to a thickness of 70 Å (0.007 μm) on the ATD. Sequentially, a photoresist pattern was formed on the ITO, and the titanium (Ti) layer, the ATD, and the ITO were etched using the photoresist pattern as a mask. Thus, a first reflective type electrode having a triple-layer structure was formed.

Second Embodiment

An aluminum and neodymium alloy was formed to a thickness of 200 Å (0.02 μm) on a substrate, a silver alloy layer, i.e., ATD (available from Hitachi) was formed to a thickness of 1000 Å (0.1 μm) on the aluminum and neodymium (Al—Nd) alloy, and indium tin oxide (ITO) was formed to a thickness of 70 Å (0.007 μm) on the ATD. Sequentially, a photoresist pattern was formed on the ITO, and the aluminum and neodymium alloy, the ATD, and the ITO were etched by wet etching using the photoresist pattern as a mask. Thus, a first reflective type electrode having a triple-layer structure was formed.

Comparative Example

ITO was formed to a thickness of 200 Å (0.02 Åm), which is the same structure as that of the conventional first electrode, on the substrate, a silver layer was formed to a thickness of 1000 Å (0.1 μm) on the ITO, and the ITO was formed to a thickness of 70 Å (0.007 μm) on the silver layer.

Figure 4A:
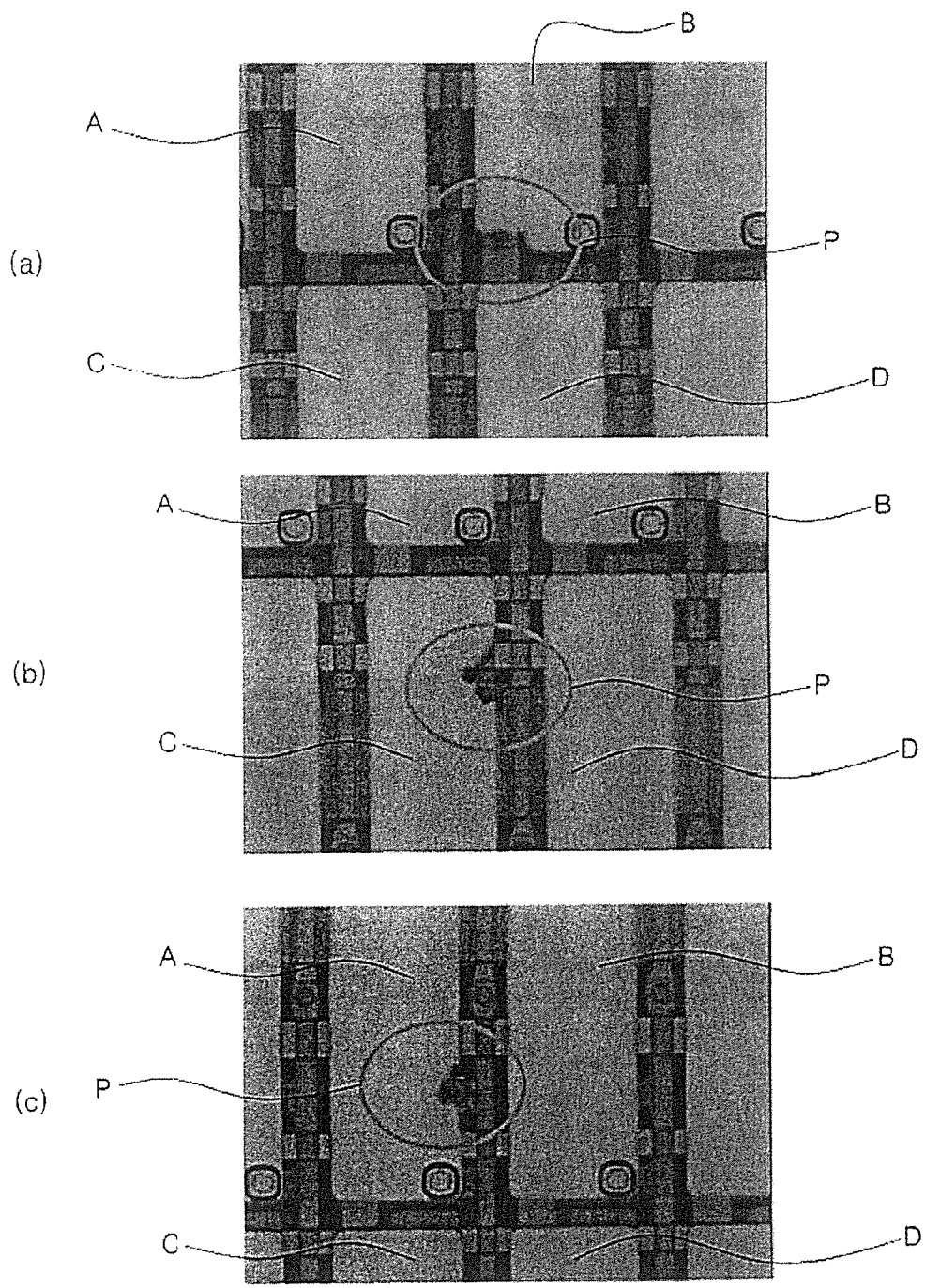
FIG. 4A illustrates photographs showing adhesion with the substrate when the first electrode of comparative example is etched by wet etching.
Figure 4B:
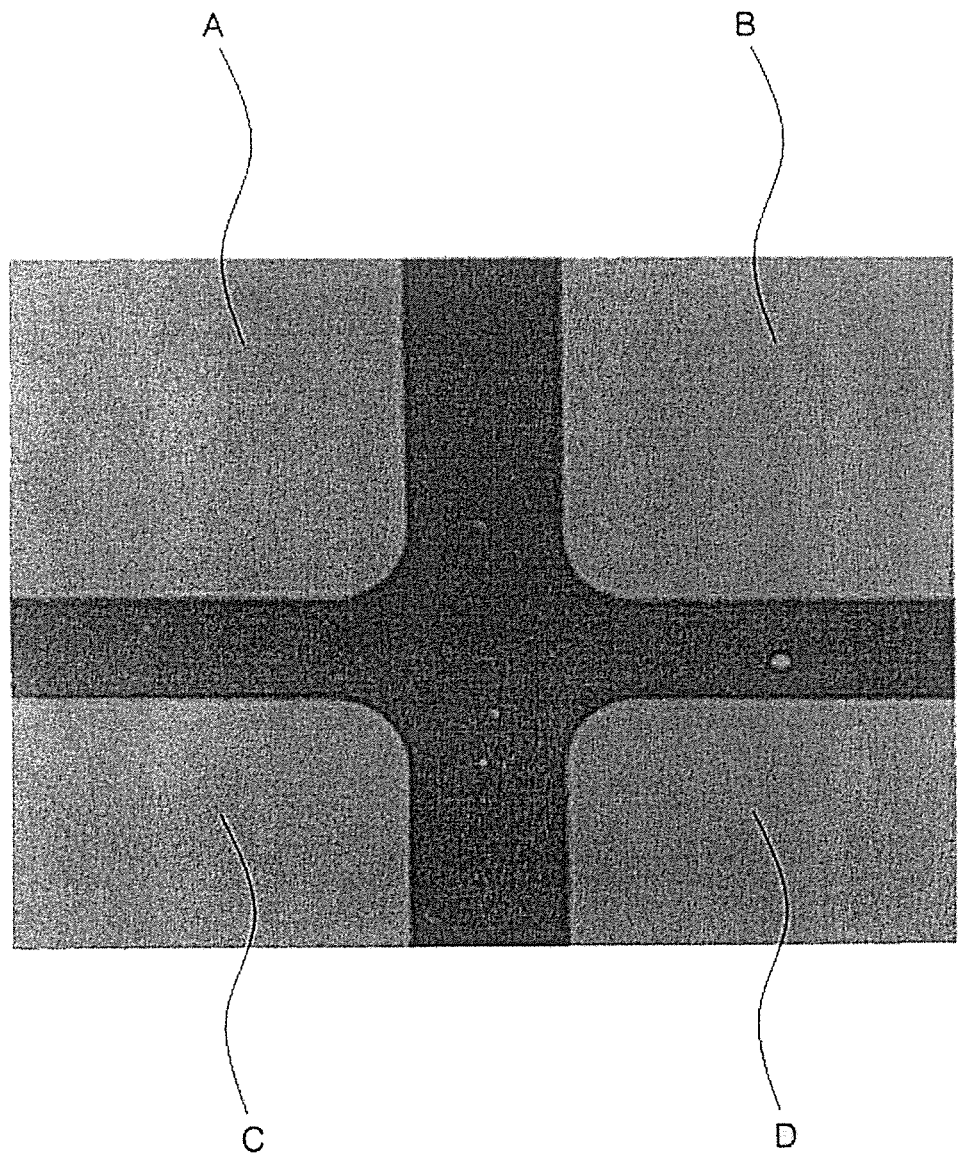
FIG. 4B is a photograph showing adhesion with the substrate when the first electrode of a second embodiment is etched by wet etching.

FIG. 4A is a picture showing adhesion with the substrate when the first electrode of the comparative example is etched by wet etching, and FIG. 4B is a picture showing adhesion with the substrate when the first electrode of the second embodiment is etched by wet etching.

Referring to FIGS. 4A and 4B, A, B, C, and D illustrated in photographs (a) (b), and (c) of FIG. 4A are unit pixels, and a peeling off phenomenon occurs due to deteriorated adhesion between the substrate of the unit pixel B illustrated in the photograph (a) of 4A and the first electrode, i.e., between the ITO and the planarization layer. Also, the peeling off phenomenon occurs in the unit pixel C illustrated in the photograph (b) of FIG. 4A, and in the unit pixel A illustrated in the photograph (c) of FIG. 4A. Since the picking phenomenon does not occur in FIG. 4B, the adhesion between the first electrode in the second embodiment and the substrate, i.e., between the aluminum-neodymium alloy and the planarization layer is very good. Here, components indicated by each reference character shown in FIG. 4A correspond to components indicated by the same character in FIG. 4B.

As described above, since titanium or aluminum having good adhesion is used as the first metal layer 180*a*, adhesion between the first electrode 180 and the planarization layer 170 may increase. Furthermore, since the second metal layer 180*b*, i.e., a reflective metal layer, is formed of silver or a silver alloy having good reflectivity, a reflection property of the first electrode 180 can be improved.

In addition, when removing the photoresist pattern using the strip solution, since a galvanic effect does not occur even if the first and second metal layers 180*a* and 180*b*, and the transparent conductive layer 180*c* are simultaneously (or concurrently) exposed to the strip solution, the layers may be blanket-etched, thereby reducing the process time.

As described above, the described embodiments of the present invention may enhance reflectivity, and adhesion between a first electrode and a planarization layer. Also, the embodiments of the present invention may reduce process time by simplifying the process.

Therefore, the embodiments of the present invention can improve reliability and yield of an organic light-emitting display device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light-emitting display device comprising:
   a substrate;
   a thin film transistor disposed on the substrate, the thin film transistor having a source and a drain respectively coupled to a source electrode and a drain electrode;
   a first electrode disposed on the substrate over the thin film transistor, the first electrode comprising a first metal layer having a thickness of 50 Å or more and 200 Å or less, a second metal layer having a thickness of 500 Å or more and 2000 Å or less, and a transparent conductive layer disposed on top of one another;
   an organic layer disposed on the first electrode and including at least one organic emission layer; and
   a second electrode disposed on the organic layer.

2. The device of claim 1, further comprising a planarization layer disposed between the thin film transistor and the first electrode.

3. The device of claim 1, wherein the first metal layer is formed of titanium (Ti), aluminum (Al), a titanium alloy or an aluminum alloy.

4. The device of claim 1, wherein the second metal layer is formed of silver or a silver alloy.

5. The device of claim 1, wherein the second electrode is formed of indium tin oxide (ITO) or indium zinc oxide (IZO).

* * * * *